(12) United States Patent
Tseng

(10) Patent No.: US 6,281,087 B1
(45) Date of Patent: Aug. 28, 2001

(54) PROCESS FOR FABRICATING METAL SILICIDE LAYER BY USING ION METAL PLASMA DEPOSITION

(75) Inventor: Horng-Huei Tseng, Hsinchu (TW)

(73) Assignee: Vanguard International Semiconductor Corporation, Hsinchu (TW)

(*) Notice: Subject to any disclaimer, the term of this patent is extended or adjusted under 35 U.S.C. 154(b) by 0 days.

(21) Appl. No.: 09/689,158

(22) Filed: Oct. 12, 2000

(51) Int. Cl.⁷ .................. H01L 21/336; H01L 21/311
(52) U.S. Cl. .................. 438/305; 438/627; 438/656; 438/734
(58) Field of Search ................... 438/721, 722, 438/305, 303, 627, 734, 653, 654, 656, 629, 592, 685

(56) References Cited

U.S. PATENT DOCUMENTS

| | | | |
|---|---|---|---|
| 5,882,399 | * 3/1999 | Ngan et al. | 117/89 |
| 5,966,607 | * 10/1999 | Chee et al. | 438/305 |
| 5,985,759 | * 11/1999 | Kim et al. | 438/653 |
| 6,025,274 | * 2/2000 | Lin et al. | 438/721 |

* cited by examiner

*Primary Examiner*—Michael Lebentritt
(74) *Attorney, Agent, or Firm*—Darby & Darby (57) ABSTRACT

The present invention provides a process for fabricating a metal silicide layer. First, a silicon substrate having a polysilicon gate region and source/drain regions thereon is provided. Then, a spacer is formed on a sidewall of the gate region. Then, a metal layer is formed on the gate region and the source/drain regions by using ion metal plasma (IMP) deposition with substantially no metal layer formed on the spacer. Finally, the metal layer is transformed into a metal silicide layer. By means of the process of the present invention, since substantially on metal or only trace metal is formed on the spacer, the unwanted metal silicide formed on the spacer can be effectively prevented, and the undesirable bridging effect can be greatly alleviated.

10 Claims, 7 Drawing Sheets

PROCESS FOR FABRICATING METAL SILICIDE LAYER BY USING ION METAL PLASMA DEPOSITION

BACKGROUND OF THE INVENTION

1. Field of the Invention

The present invention relates to a process for fabricating a metal silicide layer by using ion metal plasma deposition, and more particularly to a process for fabricating a metal silicide layer which alleviates the bridging effect.

2. Description of the Prior Art

The continued miniaturization of integrated circuits has brought about an increasing need to reduce the sheet resistance in the source/drain and gate regions. In metal-oxide-semiconductor (MOS) device manufacturing, self-aligned metal silicide layers (also known as "salicide" layers) have been used in reducing the sheet resistance of the source/drain and gate regions.

Figure 1A:
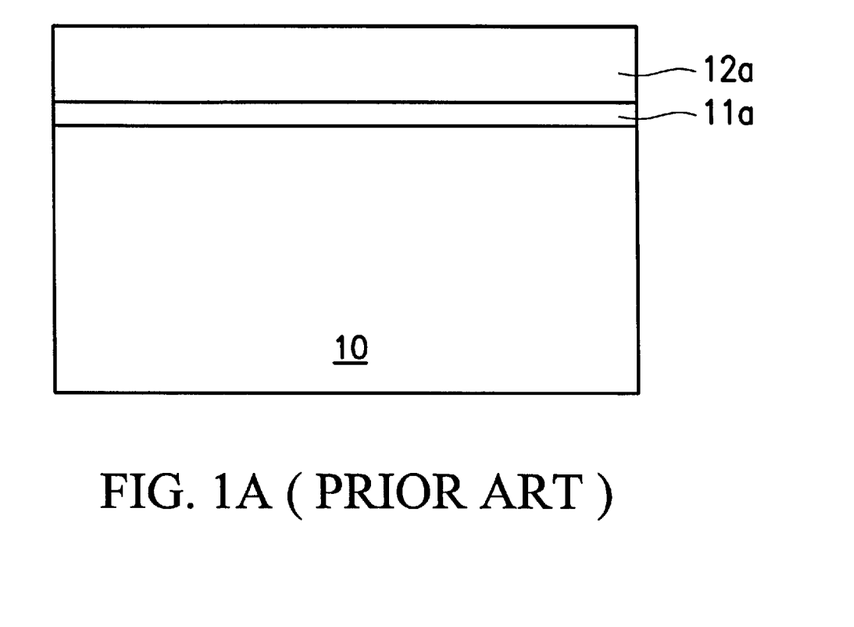
FIGS. 1A to 1F are cross-sectional views illustrating the process flow of fabricating the metal silicide according to a conventional process.
Figure 1B:
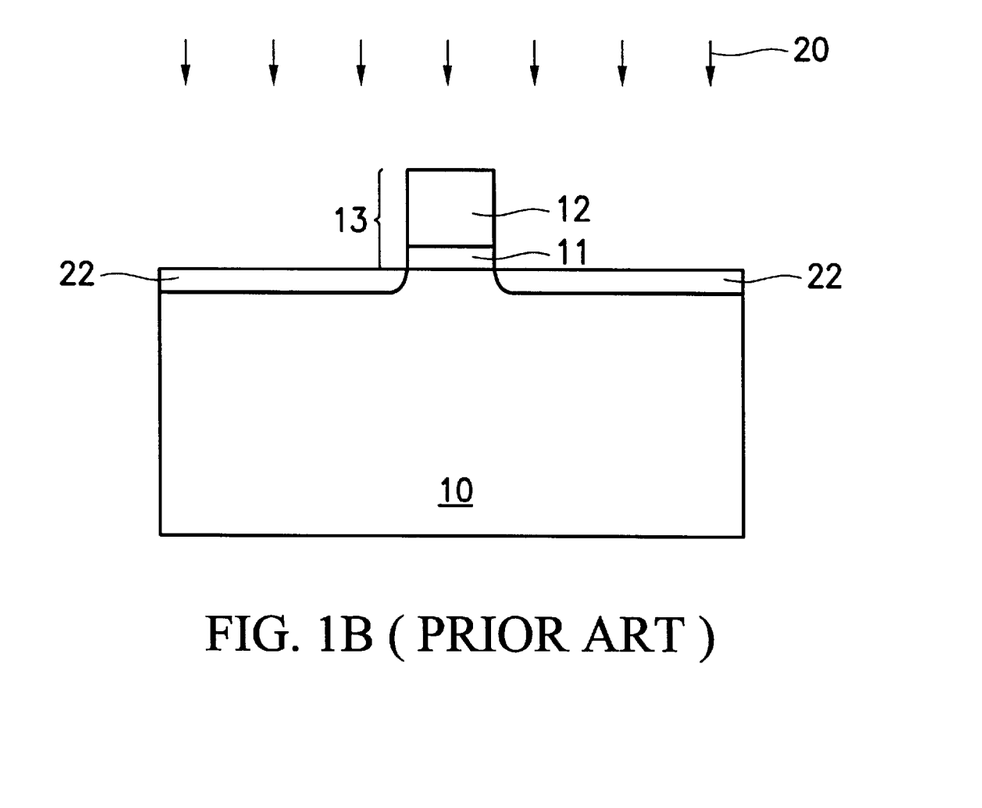

FIGS. 1A–1F show cross-sectional views illustrating the process flow of fabricating the metal salicide according to a conventional process. Referring to FIG. 1A, an oxide layer 11a and a polysilicon layer 12a are successively formed on a semiconductor substrate 10. Then, referring to FIG. 1B, the oxide layer 11a and the polysilicon layer 12a are patterned by photolithography and etching to form a gate region 13 including the patterned oxide layer 11 and the patterned polysilicon layer 12. Then, lightly-doped source and drain regions 22 are formed using a conventional ion implant method 20 using the gate region 13 as a doping mask.

Figure 1C:
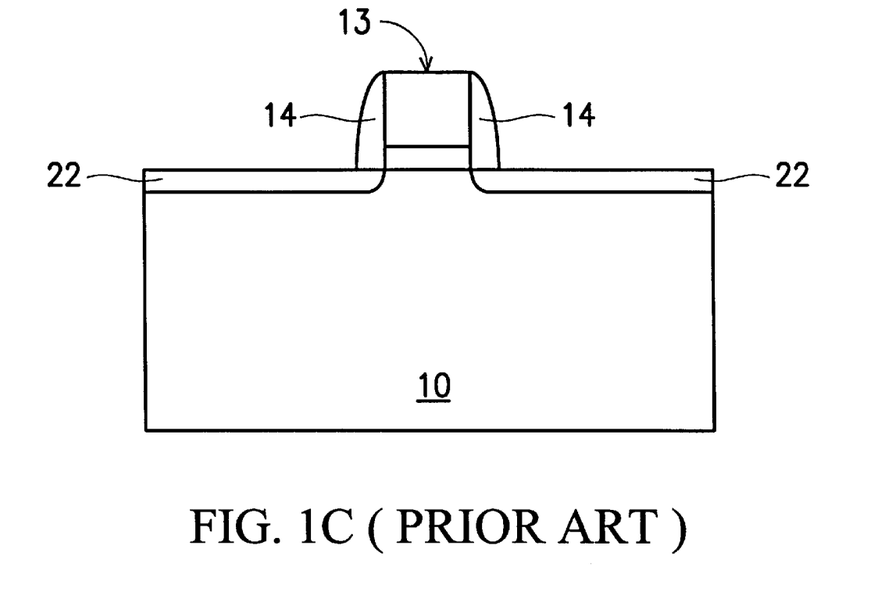

Subsequently, referring to FIG. 1C, a dielectric layer is formed over the gate region 13 and the source/drain regions 22, and then anisotropically etched using reactive ion etching (RIE) to form a spacer 14 on the sidewall of the gate region 13.

Figure 1D:
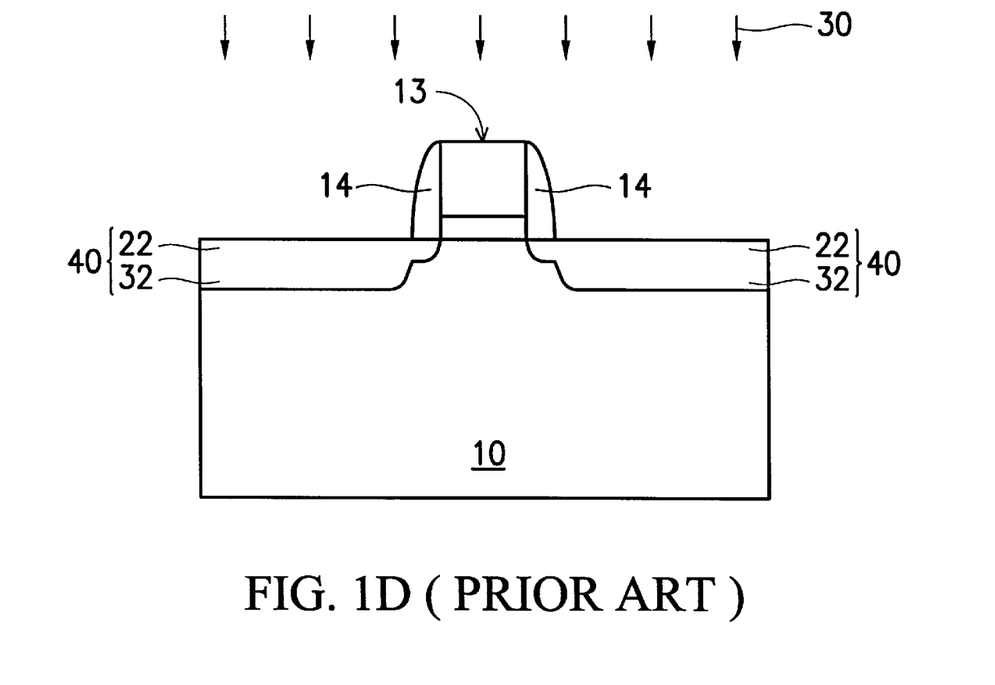

Subsequently, referring to FIG. 1D, a heavily-doped source and drain regions 32 are formed using a conventional ion implant method 30 using the gate region 13 and the spacer 14 as a doping mask. Thus, source/drain regions 40 with a lightly doped drain (LDD) structure 22 is thus formed.

Figure 1E:
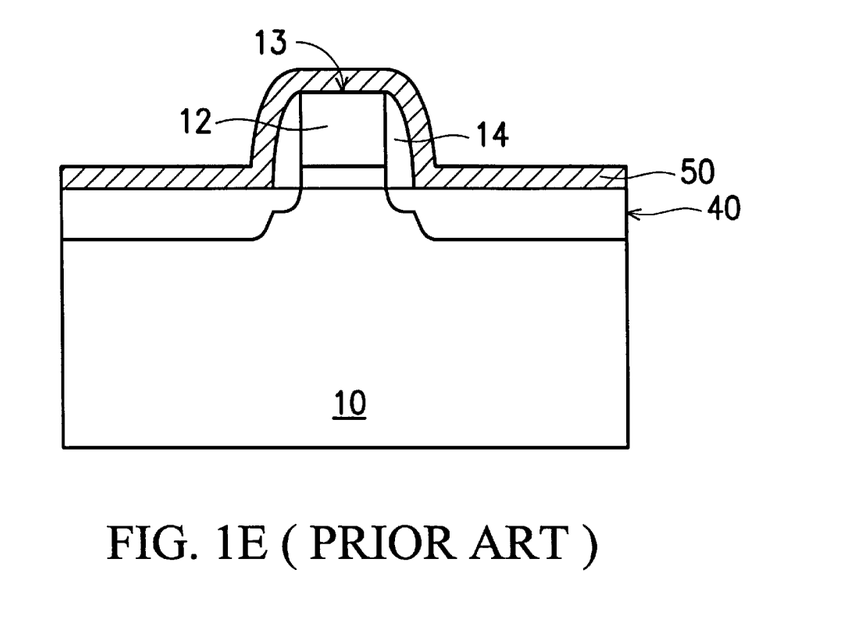
Figure 1F:
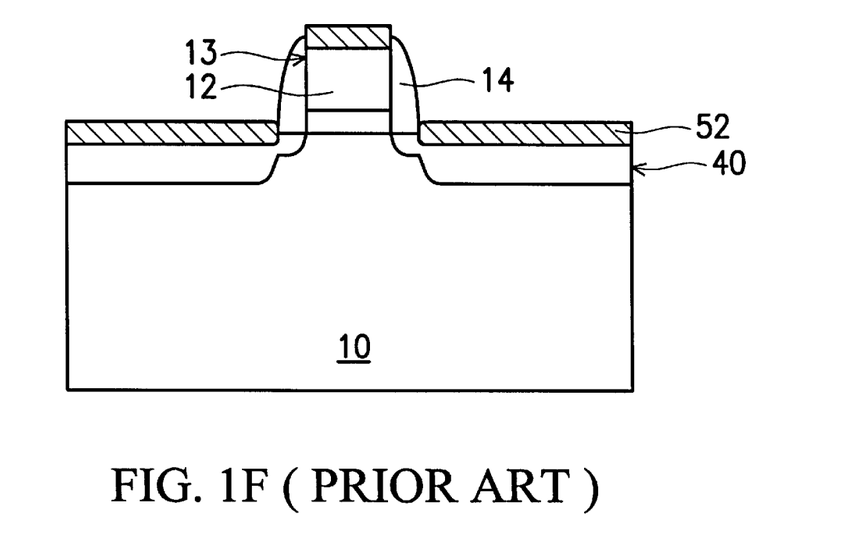

Subsequently, referring to FIG. 1E, a metal layer 50 is formed over the structure depicted in FIG. 1D. Referring then to FIG. 1F, a rapid thermal process (RTP) is then performed to make the metal layer 50 react with the silicon of the polysilicon layer 12 and the source/drain regions 40 to form a metal silicide layer 52 on both the polysilicon layer 12 and the source/drain regions 40, leaving the metal layer on the spacer substantially intact. Thus, a self-aligned metal silicide layer (also known as "salicide" layer) is formed. The metal layer 50 which did not react with silicon completely is then removed by wet etching.

One purpose of the spacer 14 is to separate the polysilicon layer 12 and the source/drain regions 40. However, in the above method, some silicon particles of the substrate 10 are very likely to diffuse onto the spacer 14 during the rapid thermal process, which react with the metal and form unwanted metal silicide on the spacer 14. This unwanted metal silicide can cause the polysilicon layer 12 to be undesirable short circuited to the source/drain regions 40. This conditions is referred to as "bridging effect".

SUMMARY OF THE INVENTION

The object of the present invention is to provide a process for fabricating a metal silicide layer, which alleviate a bridging effect.

To achieve the above object, the process for fabricating a metal silicide layer of the present invention includes:

providing a silicon substrate having a polysilicon gate region and source/drain regions thereon;

forming a spacer on a sidewall of the gate region;

forming a metal layer on the gate region and the source/drain regions by using ion metal plasma (IMP) deposition with substantially no metal layer formed on the spacer; and transforming the metal layer into a metal silicide layer.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PREFERRED EMBODIMENTS

Figure 2A:
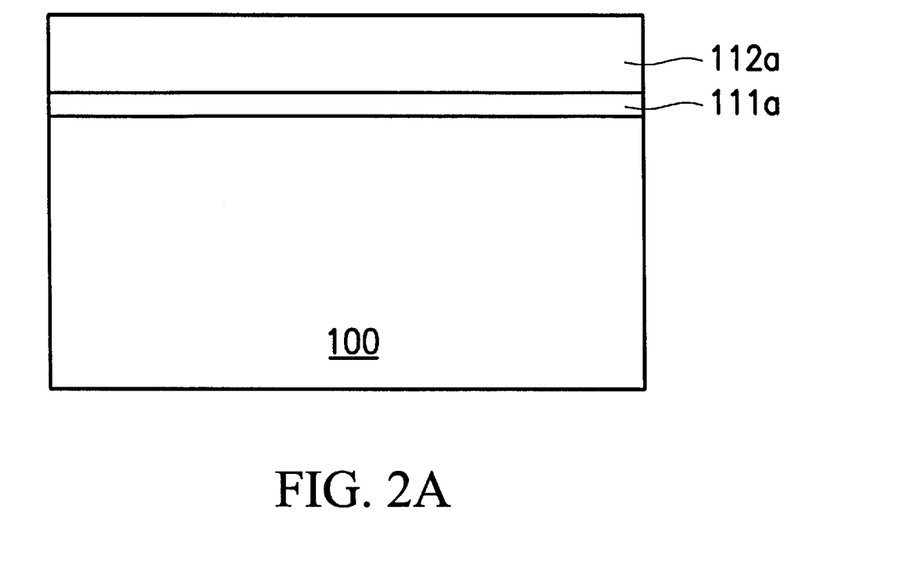
FIGS. 2A to 2G are cross-sectional views illustrating the process flow of fabricating the metal silicide according to a preferred embodiment of the present invention.

Referring to FIG. 2A, an oxide layer 111a and a polysilicon layer 112a are successively formed on a silicon substrate 100. The oxide layer 111a can be a silicon oxide layer having a thickness of 50 Å to 300 Å formed by means of thermal oxidation or chemical vapor deposition (CVD). The polysilicon layer 112a can have a thickness of 500 Å 3500 Å and be formed using any suitable low pressure chemical vapor deposition (LPCVD) process. For example, the polysilicon layer can be formed by the decomposition of silane at about 550° C. to 650° C. at a pressure of about 0.2–1.0 torr.

Figure 2B:
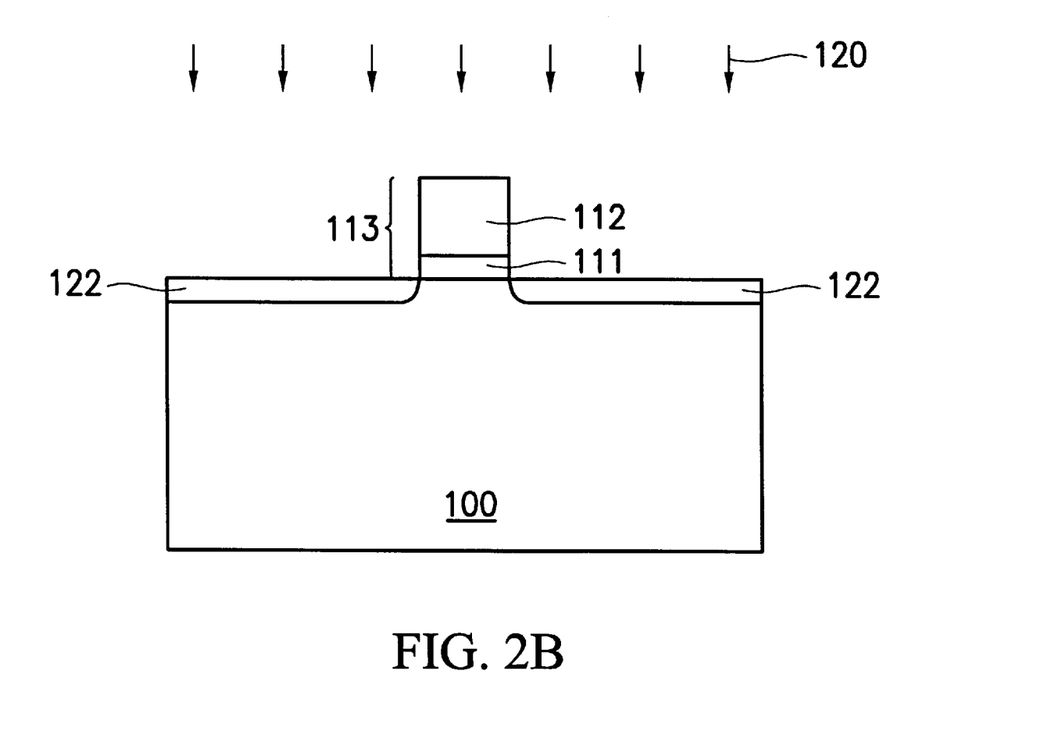

Subsequently, referring to FIG. 2B, the oxide layer 111a and the polysilicon layer 112a are patterned to form a gate region. For example, the oxide layer 111a and the polysilicon layer 112a are anisotropically etched by reactive ion etching (RIE) using a resist as a mask so as to form a gate region 113 including the patterned oxide layer 111 and the patterned polysilicon layer 112. Next, lightly-doped source and drain regions 122 are formed using a conventional ion implant method 120 using the gate region 113 as a doping mask. For example, when the substrate is of p type, a phosphorous or arsenic dopant is implanted at a dosage of about $1 \times 10^{13}$ ions/cm$^2$ with an implant energy of about 60 kilo electron volts (KeV) so as to form an NMOS structure.

Figure 2C:
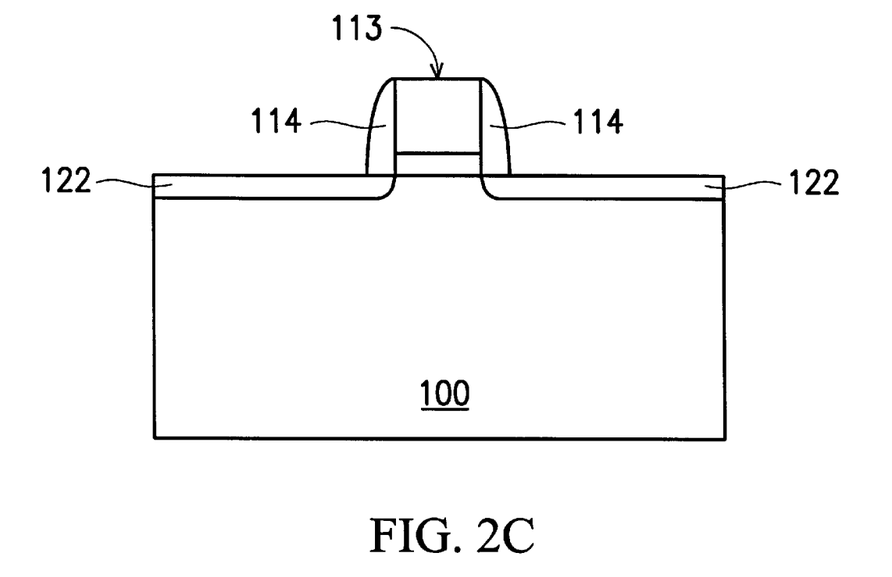

Subsequently, referring to FIG. 2C, a dielectric layer is formed over the gate region 113 and the source/drain regions 122, and then anisotropically etched to form a spacer 114 on the sidewall of the gate region 113. For example, the dielectric layer can be a silicon oxide layer or a silicon nitride layer having a thickness of 300 Å 2500 Å formed by a CVD process and etched using reactive ion etching (RIE).

Figure 2D:
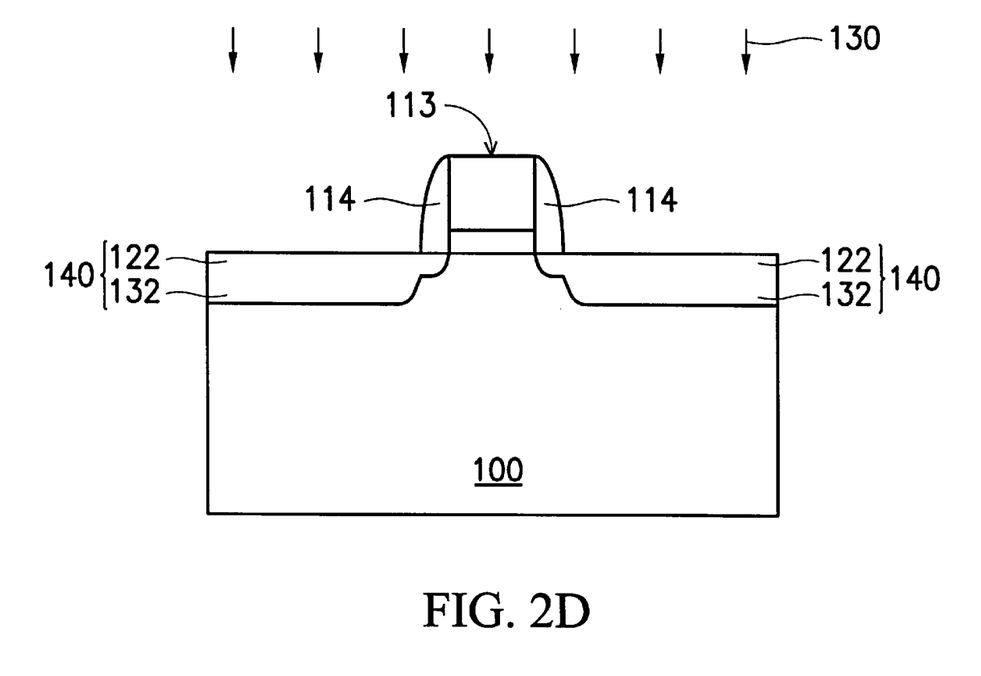

Subsequently, referring to FIG. 2D, a heavily-doped source and drain regions 132 are formed using a conventional ion implant method 130 using the gate region 113 and the spacer 114 as a doping mask. For example, a phosphorous or arsenic dopant is implanted at a dosage of about $6 \times 10^{15}$ ions/cm$^2$ with an implant energy of about 60 KeV.

Thus, source/drain regions 140 with a lightly doped drain (LDD) structure 122 is thus formed.

Subsequently, referring to FIG. 2E, a metal layer 200 is anisotropically formed only on the gate region 113 and the source/drain regions 140 by using ion metal plasma (IMP) deposition.

Figure 3:
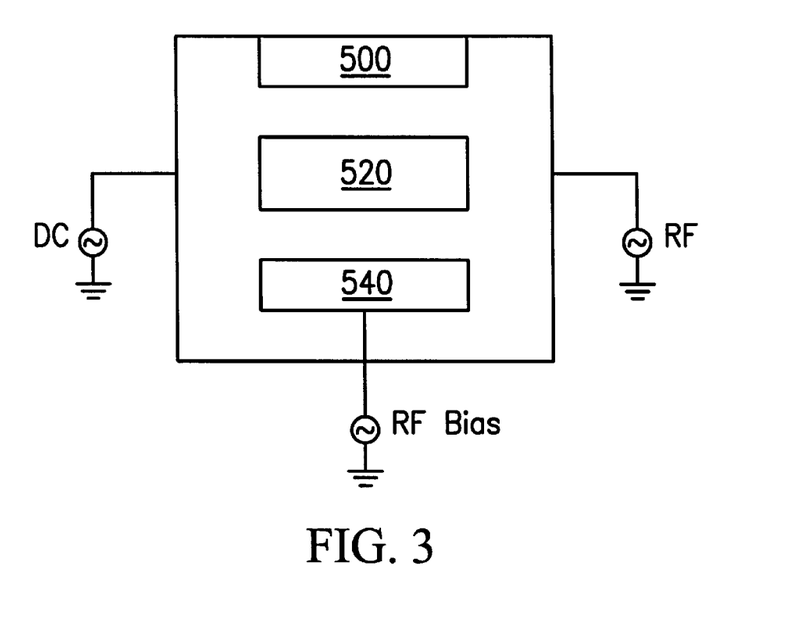
FIG. 3 is a schematic diagram showing the equipment of ion metal plasma (IMP) deposition.

The ion metal plasma (IMP) deposition process is a well-known process, but has not been used to deposit metal in silicide fabrication. FIG. 3 is a schematic diagram showing the equipment of IMP, in which symbol 500 indicates a metal target, symbol 520 an inductively coupled plasma source for producing plasma, and symbol 540 a substrate on which a RF bias is applied. The metal target 500 is sputtered off upon encountering the plasma and then ionized by the RF power. The ionized metal is then accelerated toward the surface of the substrate 540. The resultant metal deposition is unidirectional and perpendicular to the substrate.

The metal layer 200 can be a refractory metal layer made of titanium, niobium, zirconium, chromium, hafnium, platinum, palladium, cobalt, or nickel having a thickness of 50 Å to 300 Å. The preferred choice for forming a refractory metal silicide is titanium. $TiSi_2$ has the lowest resistivity among the refractory metal silicides. In addition, Ti can form $TiSi_2$ upon annealing at low reaction temperatures.

Subsequently, referring to FIG. 2F, the metal layer 200 is transformed into a metal silicide layer 220. For example, the structure of FIG. 2E is subjected to a first thermal treatment at a temperature of 600° C. to 900° C. to react the metal layer 200 with the silicon of the polysilicon layer 112 and the source/drain regions 140 to form a refractory metal silicide layer 220 on both the polysilicon layer 112 and the source/drain regions 140. In a typical embodiment, a conventional furnace annealing or rapid thermal process (RTP) is used. When the metal layer 200 used is a titanium layer, the metal silicide layer 220 thus formed is a titanium silicide ($TiSi_2$) layer. The metal silicide layer 220 has a thickness of about 200 Å to 700 Å, consuming about 100 to 300 Å of silicon or polysilicon.

Figure 2E:
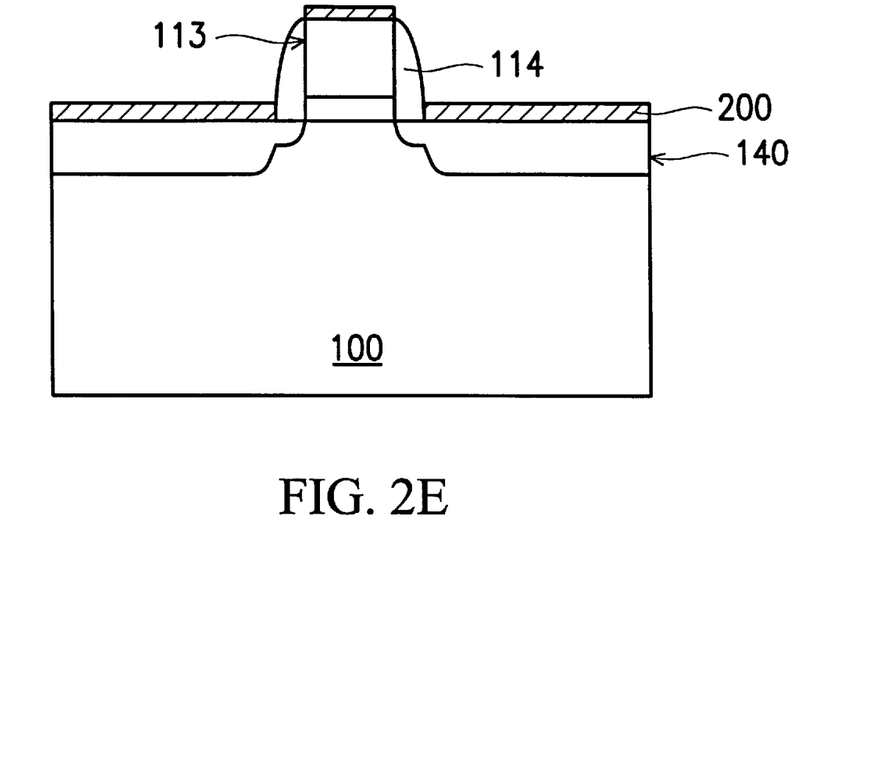
Figure 2F:
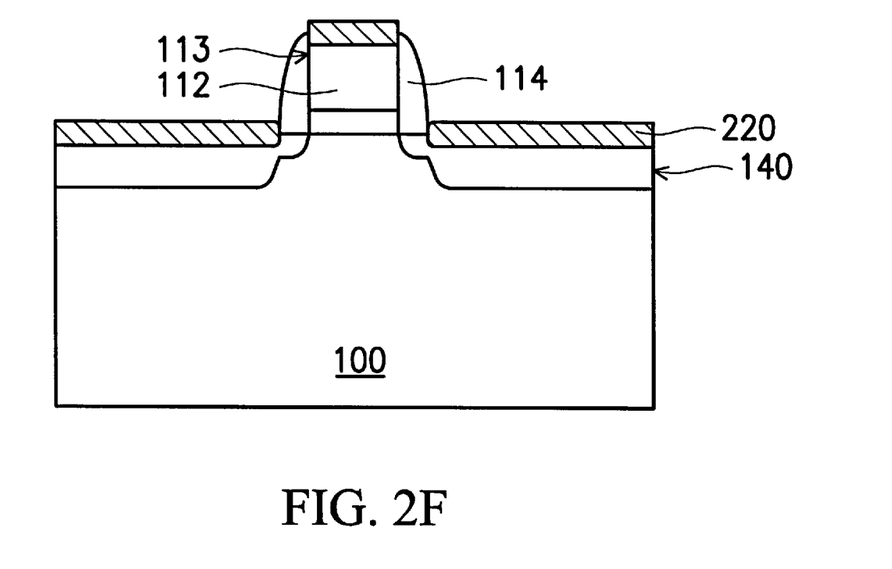

As mentioned above, since the IMP deposition process has the feature of depositing the metal layer in an unidirectional manner, there is substantially no metal layer formed on the spacer 114 (as shown in FIG. 2E) or only a very thin metal layer is formed on the spacer 114. Therefore, after the thermal treatment is performed to the structure of FIG. 2E, substantially no metal silicide is formed on the spacer 114. Even if some silicon particles of the substrate 100 diffuse into the spacer 114 during the thermal treatment, the unwanted metal silicide formed on the spacer 114 can be effectively prevented, and the undesirable bridging effect can be greatly alleviated.

Subsequently, the unreacted metal can be selectively removed through the use of an etchant that removes only the metal but not the metal silicide and the spacer. In one embodiment, an etchant of $HCl:H_2O_2$ in a volume ratio of 3:1 at room temperature is used to remove the unreacted metal.

Figure 2G:
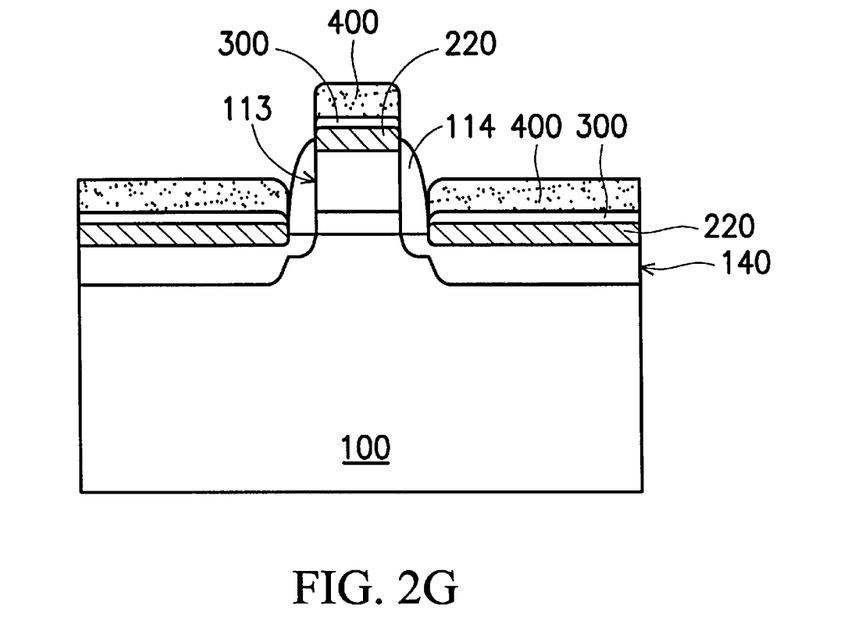

Subsequently, referring to FIG. 2G, a metal nitride layer 300 and a refractory metal layer 400 are successively formed on the metal silicide layer 220. For example, a second thermal treatment in a nitrogen-containing gas at 600° C. to 900° C. is performed so as to convert the surface of the metal silicide layer 200 to metal nitride. The nitrogen-containing gas can be nitrogen ($N_2$) or ammonia ($NH_3$). When the metal silicide is titanium silicide, the metal nitride formed is titanium nitride. The metal nitride is formed in a self-aligned manner without the need of photolithographic masks. Then, a refractory metal layer having a thickness of 1000 Å 3500 Å is deposited by chemical vapor deposition (CVD). The suitable refractory metal can be tungsten, molybdenum or tantalum. When tungsten (W) is used, the tungsten layer can be formed by using $WF_6$ and $SiH_4$ as reactants. Then, the tungsten layer is anisotropically etched by reactive ion etching (RIE) using $WF_6$ as the etching gas such that the patterned tungsten layer only appears on the gate region 113 and the source/drain regions 140.

The additional metal nitride layer 300 and the refractory metal layer 400 are optional and can further decrease the sheet resistance of the source/drain and gate regions.

In conclusion, the present invention uses the ion metal plasma process to form the refractory metal for the subsequent formation of metal silicide. In this manner, substantially on metal or only trace metal is formed on the spacer. Therefore, even if some silicon particles of the substrate diffuse into the spacer during the thermal treatment, the unwanted metal silicide formed on the spacer can be effectively prevented, and the undesirable bridging effect can be greatly alleviated.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A process for fabricating a metal silicide layer, comprising:

(a) providing a silicon substrate having a polysilicon gate region and source/drain regions thereon;

(b) forming a spacer on a sidewall of the gate region;

(c) forming a metal layer on the gate region and the source/drain regions by using ion metal plasma (IMP) deposition with substantially no metal layer formed on the spacer;

(d) transforming the metal layer into a metal silicide layer;

(e) forming a meta nitride layer on the metal silicide layer; and (f) forming a refractory metal layer on the metal nitride layer.

2. The process as claimed in claim 1, wherein the polysilicon gate region includes an oxide layer on the substrate and a polysilicon layer on the oxide layer.

3. The process as claimed in claim 1, wherein the metal layer is made of a metal selected from the group consisting of titanium, niobium, zirconium, chromium, hafnium, platinum, palladium, cobalt, and nickel.

4. The process as claimed in claim 1, wherein the source/drain region s are formed by ion implanting.

5. The process as claimed in claim 4, wherein step (d) is performed by subjecting the metal layer to a thermal treatment to react the metal layer with the silicon of the polysilicon gate region and the source/drain regions.

6. The process as claimed in claim 5, wherein the thermal process is conducted at a temperature of 600° C. to 900° C.

7. The process as claimed in claim 1, further comprising, after step (d), a step of removing unreacted metal.

8. The process as claimed in claim 7, wherein the removing step is conducted by wet etching.

9. The process as claimed in claim 1, wherein the metal nitride layer is formed by converting the surface of the metal silicide layer in a nitrogen-containing gas.

10. The process as claimed in claim 1, wherein the refractory metal layer formed on the metal nitride layer is made of a metal selected from the group consisting of tungsten, molybdenum, and tantalum.

* * * * *